United States Patent

Sasaki et al.

Patent Number: 5,573,170
Date of Patent: Nov. 12, 1996

[54] BUMP FORMING APPARATUS

[75] Inventors: Junichi Sasaki; Masataka Itoh; Hiroshi Honmou; Yoshinobu Kaneyama, all of Tokyo, Japan

[73] Assignee: NEC Corporation, Japan

[21] Appl. No.: 353,134

[22] Filed: Dec. 9, 1994

[30] Foreign Application Priority Data

Dec. 14, 1993 [JP] Japan ................................. 5-313317
Jun. 27, 1994 [JP] Japan ................................. 6-144279

[51] Int. Cl.$^6$ .......................... B23K 20/02; B23K 28/02
[52] U.S. Cl. .............................. 228/14; 228/13; 228/41
[58] Field of Search .......................... 228/13, 15.1, 41, 228/170, 14; 72/431; 83/588

[56] References Cited

U.S. PATENT DOCUMENTS

| | | | |
|---|---|---|---|
| 3,958,476 | 5/1976 | Bartha | 83/588 |
| 4,341,137 | 7/1982 | Leitch et al. | 83/588 |
| 5,269,213 | 12/1993 | Coneski et al. | 83/588 |
| 5,445,057 | 8/1995 | Fujita | 83/588 |

FOREIGN PATENT DOCUMENTS 5-65847  3/1992  Japan .
4-152682  5/1992  Japan .

Primary Examiner—Samuel M. Heinrich
Assistant Examiner—Jeffrey T. Knapp
Attorney, Agent, or Firm—Laff, Whitesel, Conte & Saret, Ltd.

[57] ABSTRACT

In an apparatus for punching a metallic sheet to stamp out a bump and bonding it to a substrate, an AuSn sheet is heated to above a softening point thereof by a heater. A solenoid is energized to cause a punch and a die to stamp out a bump from the AuSn sheet. The bump is directly bonded to a substrate. The punch is made up of a shank portion and a punch portion. A punch holder for guiding the shank portion and punch portion with high accuracy molded integrally with the die. The punch is connected to the solenoid with the intermediary of a damper spring. When the bump hits against the substrate, the damper spring prevents it from chipping off or cracking due to an impact. Subsequently, another solenoid is energized to move the punch further downward, thereby pressing the bump against the substrate for a sufficient period of time.

7 Claims, 8 Drawing Sheets

Fig. 1A
PRIOR ART
Fig. 1B
PRIOR ART
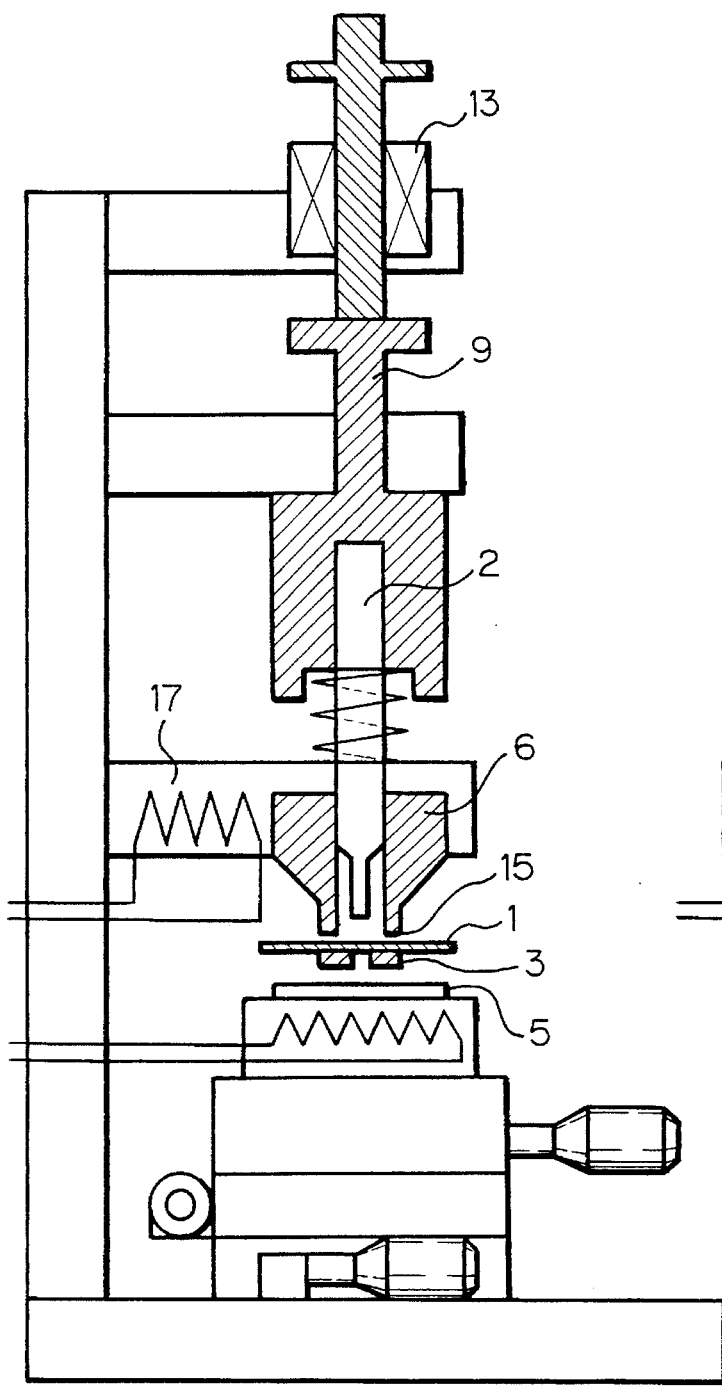
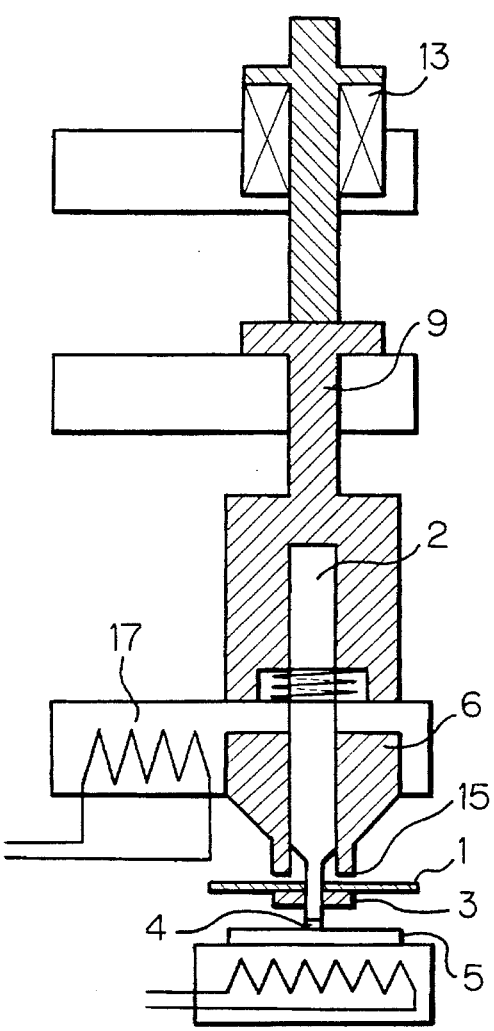

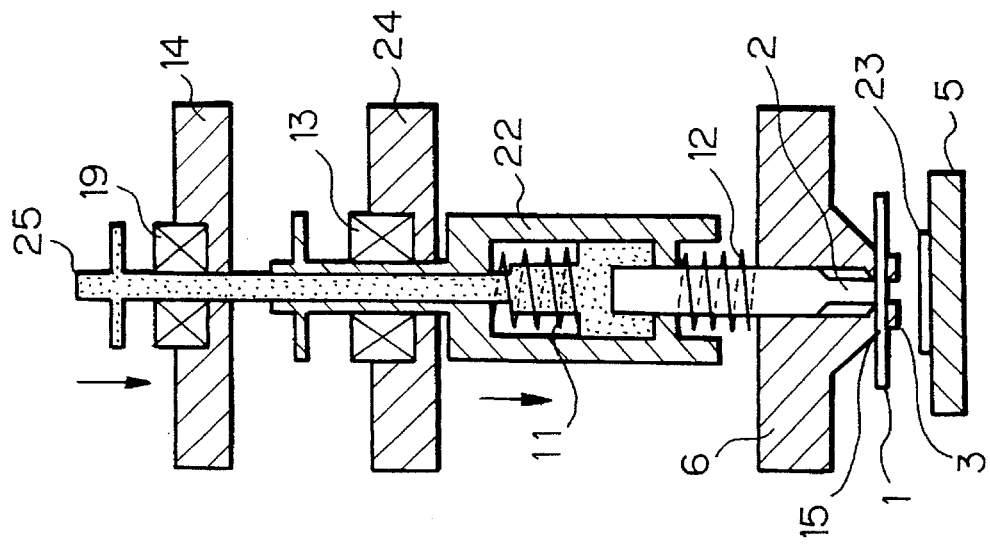
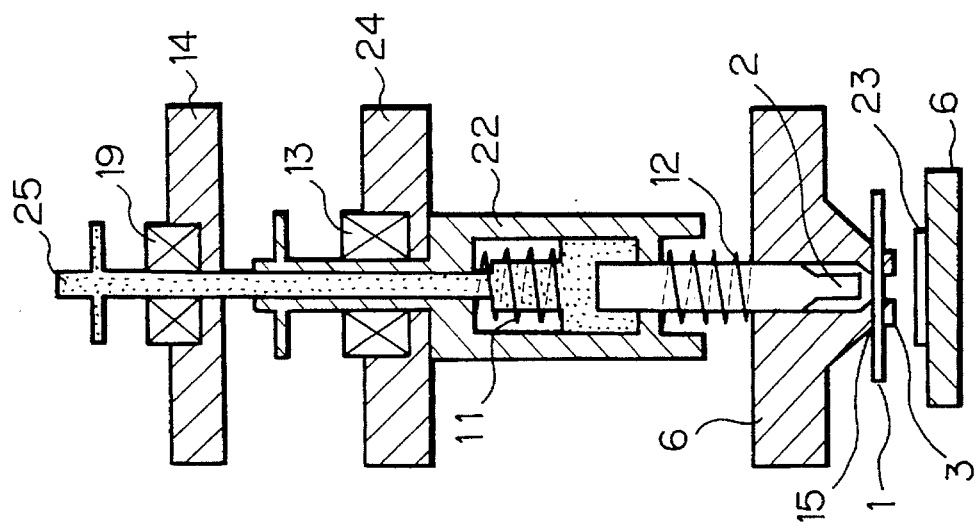

BUMP FORMING APPARATUS

BACKGROUND OF THE INVENTION

The present invention relates to an apparatus for forming a bump and bonding it to a substrate with uniform and sufficient strength. Such bumps are used to mount semiconductor devices or optical devices on a substrate.

In the high density semiconductor devices mounting art, as well as in optical devices mounting art, use is made of flip chip bonding which bonds a device and a substrate via minute bumps and can reduce module size. As for semiconductor devices, flip chip bonding allows bonding points to be arranged in a higher density than wire bonding, TAB (Tape Automated Bonding) and other bonding technologies, thereby increasing packaging density and reducing apparatus size. Another advantage available with flip chip bonding is that when a bump is caused to reflow, an accurate bonding position is achievable due to a self-alignment effect which is derived from the surface tension of the melted bump. Therefore, when an optical device is mounted on a substrate, it is not necessary to adjust the optical axis of the device and those of a waveguide, optical fiber and other optical parts. This successfully reduces the mounting cost of optical modules and, therefore, the cost of optical modules.

When a semiconductor device or an optical device is to be mounted on a substrate by flip chip bonding, it is necessary to form bumps on one or both of the substrate and device. To form bumps, electrode pads provided on a substrate may be subjected to plating, vapor deposition, sputtering, solder paste printing or transfer bump procedure by way of example. On the other hand, a procedure capable of forming bumps on the desired positions of a substrate rapidly without resorting to a time-consuming vacuum process is also available. This kind of procedure punches a thin ribbon-like metallic material with a punch and a die and then directly bonds, with the remaining force, the resulting bump to a substrate by thermo-compression, as taught in, for example, Japanese Patent Laid-Open Publication Nos. 4-65847 and 4-152682.

The prerequisite with the above punching scheme is that bumps be stamped out from the ribbon in a constant volume at all times. Another prerequisite is that the bumps be bonded to a substrate by suficient strength while being prevented from chipping off or cracking. However, the conventional punching procedure is apt to cause bumps to chip off or crack when they are stamped out from a substrate, so that uniform bumps are not attainable.

SUMMARY OF THE INVENTION

It is, therefore, an object of the present invention to provide a bump forming apparatus capable of forming uniform bumps stably.

In accordance with the present invention, an apparatus for punching a metallic sheet to stamp out a bump and bonding it to a substrate has a punch and a die for punching the metallic sheet in cooperation, a drive source for lowering the punch toward the die, and a damping member connecting the punch and drive source.

Also, in accordance with the present invention, an apparatus for punching a metallic sheet to stamp out a bump and bonding it to a substrate has a punch and a die for punching the metallic sheet and bonding the resulting bump to the substrate, a first drive source for driving the punch, and a second drive source for further pressing, after the bump has been stamped out, the bump against the substrate. The punch and first and second drive sources have their axes of operation aligned with each other.

BRIEF DESCRIPTION OF THE DRAWINGS

The above and other objects, features and advantages of the present invention will become more apparent from the following detailed description taken with the accompanying drawings in which:

FIGS. 1A and 1B are sections of a conventional bump forming apparatus;

FIGS. 4A–4D are sections showing a second embodiment of the present invention;

DESCRIPTION OF THE PREFERRED EMBODIMENTS

Figure 2A:
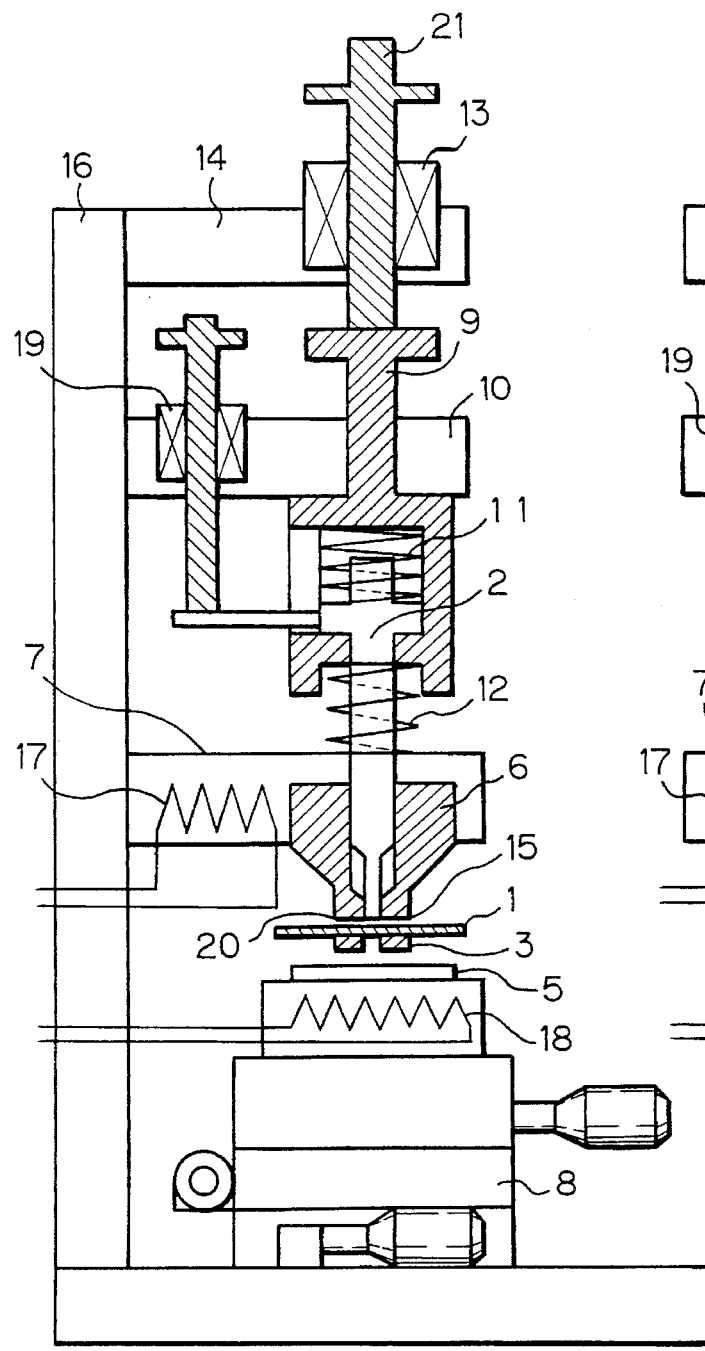
FIGS. 2A and 2B are sections showing a bump forming apparatus embodying the present invention.

To better understand the present invention, a brief reference will be made to a conventional bump forming apparatus, shown in FIGS. 1A and 1B. Briefly, the apparatus is of the type punching a thin ribbon-like metallic material with a punch and a die and bonding the resulting bump to a substrate by thermo-compression. As shown, the apparatus has a punch holder 6 formed with a slit 15 at the tip thereof. A thin sheet of metal, i.e., AuSn sheet 1 is inserted into the slit 15. When a solenoid 13 is energized, the force of the solenoid 13 is transmitted to a punch 2 via a connecting rod 9. As a result, the punch 2 punches the AuSn sheet 1 in cooperation with a die 3. A bump 4 stamped out from the sheet 1 is directly bonded by thermo-compression to a metallized portion existing on a substrate 5. This kind of apparatus, however, has a problem that since the punch 2 is directly affixed to the connecting rod 6, the bump 4 is pressed against the substrate 5 by the same force as the force which stamped it out from the sheet 1. This is apt cause the bump 4 to chip off or crack. Further, since the die 3 is connected to the punch holder, or punch guide, 6 by adhesive, it is apt to come off the punch holder 6 due to great force which acts on its adhered surface at the time of punching. In addition, when the hole of the die 3 and the axis of the punch holder 6 are misaligned in the event of adhesion, the misalignment displaces the punching position and causes the punch 2 to wear. Generally, the punch 2 is made up of a shank portion having a diameter of 1 mm and a punch portion having a diameter of 140 µm. Since the punch holder 6 guides only such a shank portion, it is extremely difficult to provide the punch holder 6 with a guide hole whose inside diameter is exactly several microns greater than the diameter of the shank portion, i.e., 1 µm. The punch holder 6 is, therefore, unable to guide the punch portion of the punch 2, whose diameter is 140 µm, to the center of the die 3 having an inside diameter of 150 µm with an accuracy of several microns, resulting in the displacement of the punching position and wear. Moreover, when the bump 4 is pressed against the substrate 5, the load on the bump 4 lasts only for an extremely short period of time due to the overshoot of the punch 2. This obstructs the mutual metallic diffusion of the bump 4 and the metallized portion the substrate 5 and thereby reduces the bonding strength. Although a heater 17 is provided for heating the sheet 1, the bump 4 is apt to chip off or crack in the event of punching if the heating temperature of the heater 17 is lower than the softening point of the sheet 1.

Figure 2B:
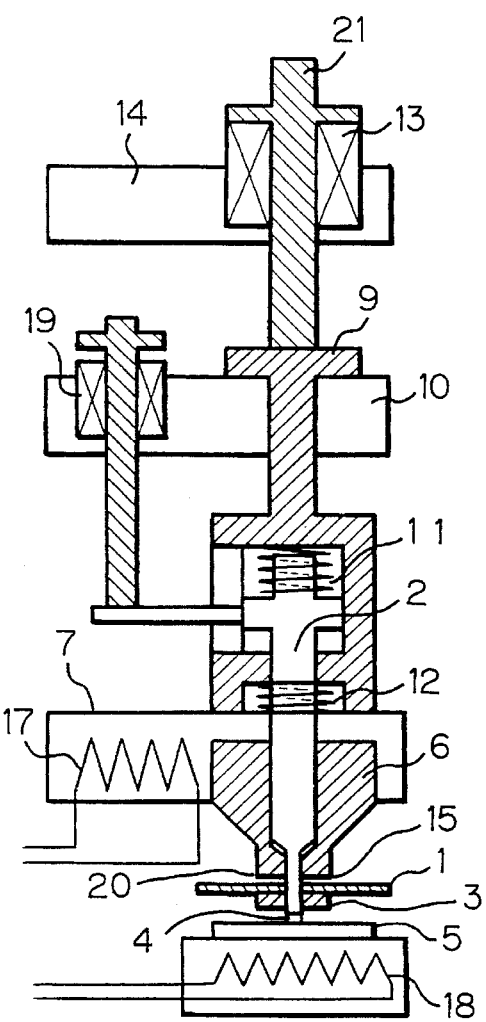
Figure 5:
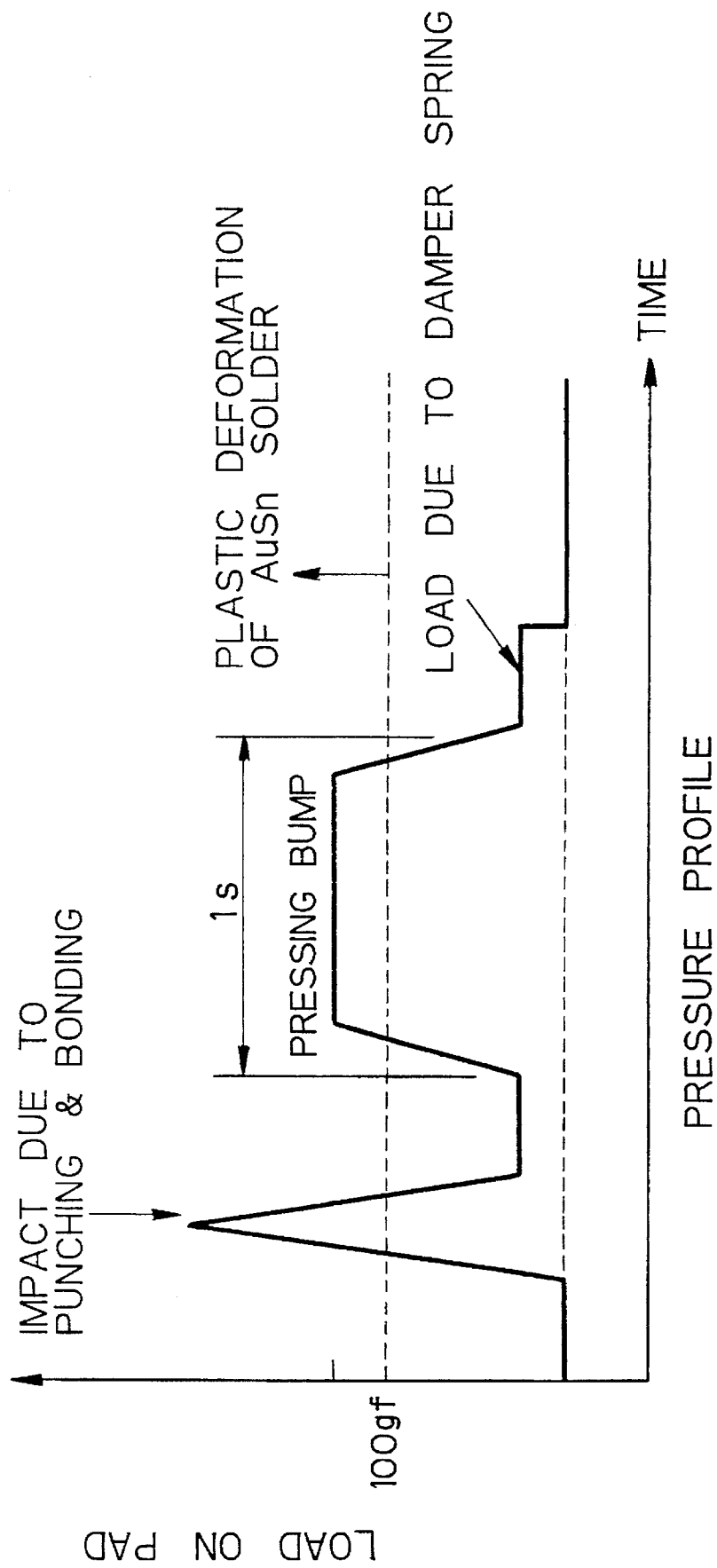
FIG. 5 shows a pressure profile particular to the second embodiment.

Referring to FIG. 2A, a bump forming apparatus embodying the present invention is shown. As shown, the apparatus has a punch holder 6 formed with a 150 μm high and 1.1 mm wide slit 15 at the tip or lower end thereof. A 70 μm thick and 1 mm wide AuSn solder sheet 1 is inserted into the slit 15. The punch holder 6 is molded integrally with a die 3. The punch holder 6 is supported by an arm 7 in which a heater 17 is disposed. The heater 17 heats the AuSn sheet 1 to 150° C. which is higher than the softening point of AuSn. An XYZ stage 8 effects positioning such that the axis of a punch 2 lies just above the position of a substrate 5 where a bump 4 should be stamped out. When a solenoid 13 is energized, the force of the solenoid 13 is transmitted to a connecting rod 9. The solenoid 13 and rod 9 are supported by arms 14 and 10, respectively. The arms 7, 10 and 14 supporting the punch holder 6, connecting rod 9 and solenoid 13, respectively, are supported by a post 16. A damper spring 11 exerts a force slightly weaker than the force of a punch return spring 12 which is loaded between the connecting rod 9 and the arm 7. In this configuration, when the connecting rod 9 is lowered, the damper spring 11 compressed first, and then the rod 9 directly abuts against the top of the punch 2. Subsequently, as shown in FIG. 2B, the punch 2 and die 3 punch the AuSn sheet 1 to produce a bump 4. The bump 4 is pressed against the substrate 5 by the punch 2. At this moment, the first peak of the pressure profile as appears shown in FIG. 5.

In the illustrative embodiment, the punch holder 6 has a guide hole having a diameter of about 1 mm. The punch 2 has a shank portion having a diameter of 1 mm and a punch portion having a diameter of 140 μm and a length of 1 mm. The die has an inside diameter of 150 μm and a hole which is 300 μm long. The hole of the die 3 may be provided with a greater diameter at the upper end, or bump inlet, than at the lower end or bump outlet. This will successfully prevent the bump 4 from being caught by the die 3 when it leaves the die hole, thereby reducing the displacement of the punching position. The damper spring 11 serves to damp the force with which the bump 4 hits against the substrate 5.

The punch 2 is brought to a stop when the lower end of the connecting rod 9 abuts against the punch holder arm 7. The solenoid 13 has a plunger 21. The rod 9 and the plunger 21 of the solenoid 13 are each movable by about 1 mm. The punch 2 is movable relative to the rod 9 by 300 μm. The distance between the tip of the punch 2 and the upper surface of the substrate 5 is so adjusted by the XYZ stage 8 as to be smaller than the thickness of the AuSn sheet 1, but greater than zero, when the punch 2 is lowered. Subsequently, a solenoid 19 is energized to further press the punch 2 with the result that the bump 4 is pressed against the substrate 5 for about 0.5 to 1 second. This part of the procedure represented by a table-like portion shown in FIG. 5 and following the first peak. A heater 18 heats the substrate 5 to about 150° C. in order to promote the mutual metallic diffusion of the metallized portion of the substrate 5 and the bump 4, thereby enhancing the bonding strength of the bump 4. Finally, the solenoids 19 and 13 are deenergized. As a result, the punch 2 is raised to the initial position thereof by the punch return spring 12. It is to be noted that the guide hole of the punch holder 6 includes a reduced diameter portion 20 having the same inside diameter as the die 3, i.e., 150 μm. The reduced diameter portion 20 not only guides the punch 2 with higher accuracy but also removes the punch 2 from the sheet 1 in the event of the return of the punch 2.

The illustrative embodiment is practicable not only with the AuSn sheet 1 but also with a sheet of PbSn, Au or any other suitable material The solenoid 13 and 19, respectively playing the role of a punch drive source and means for pressing the bump 4, may be replaced with piezoelectric actuators, voice coils or other suitable actuators. A heat insulating material may be interposed between the post 16 and the punch holder arm 6 in order to heat the AuSn sheet 1 efficiently. For the same reason, a heat insulating member may be disposed between the stage 8 and the heater 18. With this kind of implementation, it is possible to prevent the distance between the tip of the punch 2 and the substrate 5 from changing.

Figure 3:
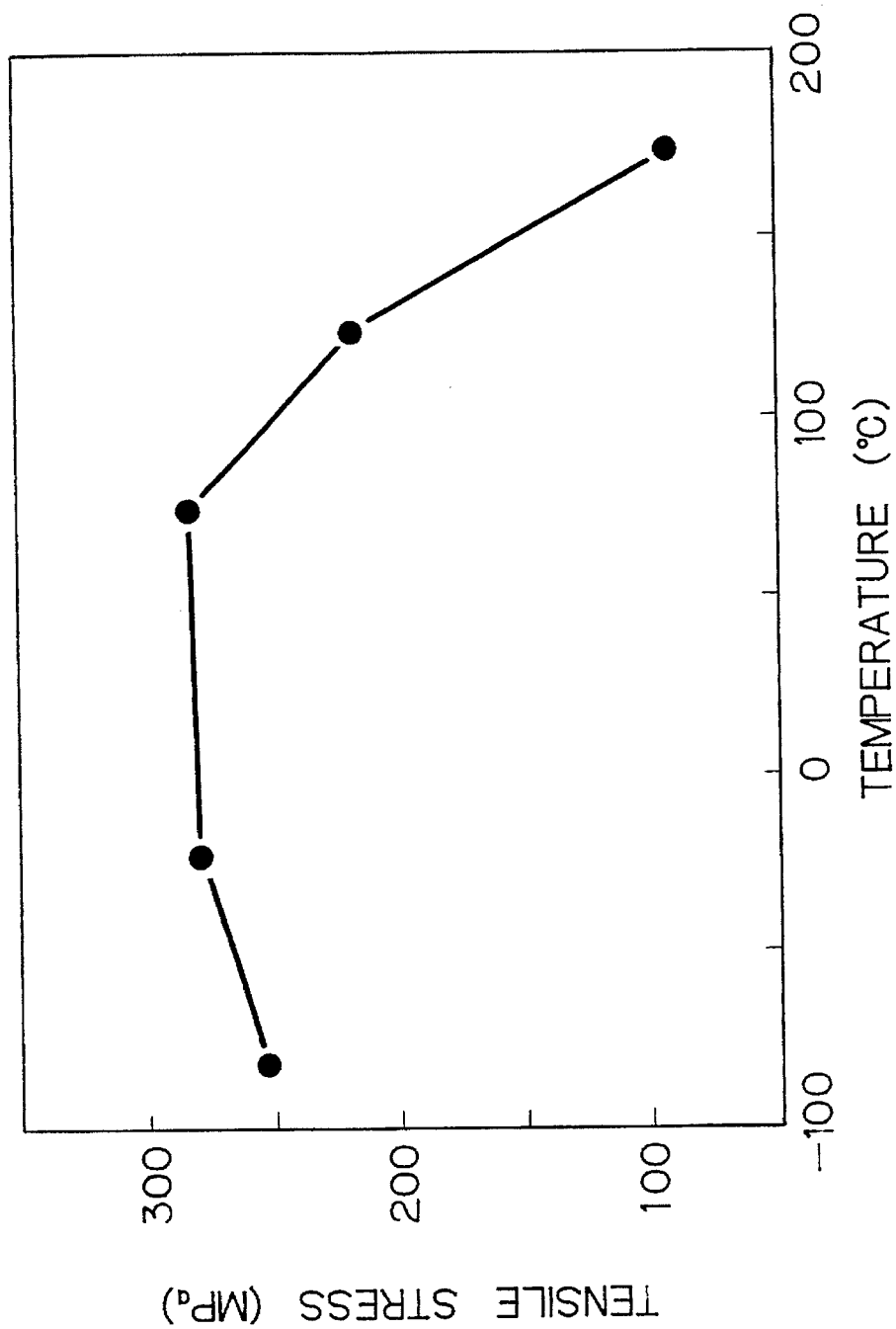
FIG. 3 is a graph indicating the temperature dependency of the tensile stress of AuSn.
Figure 4C:
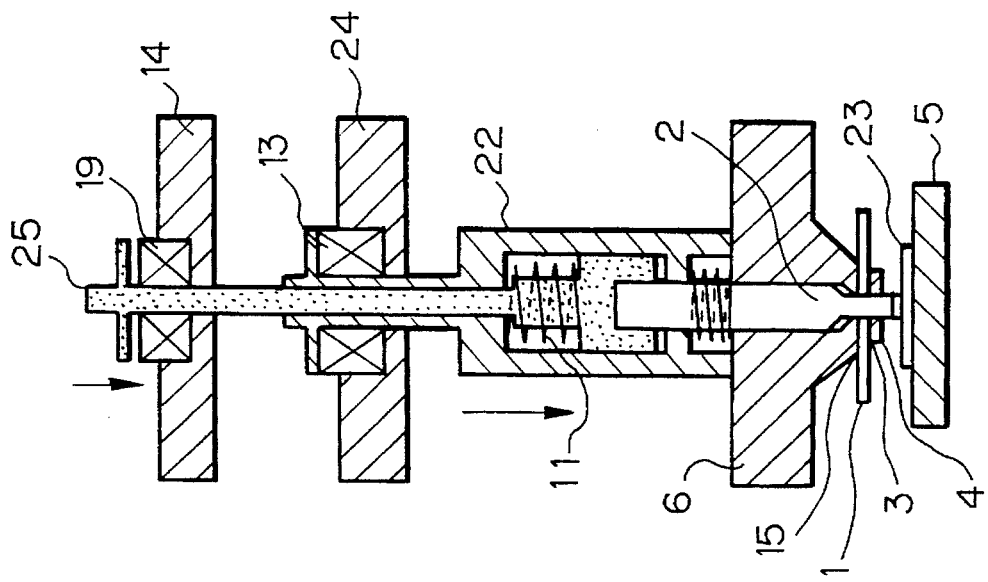
Figure 4D:
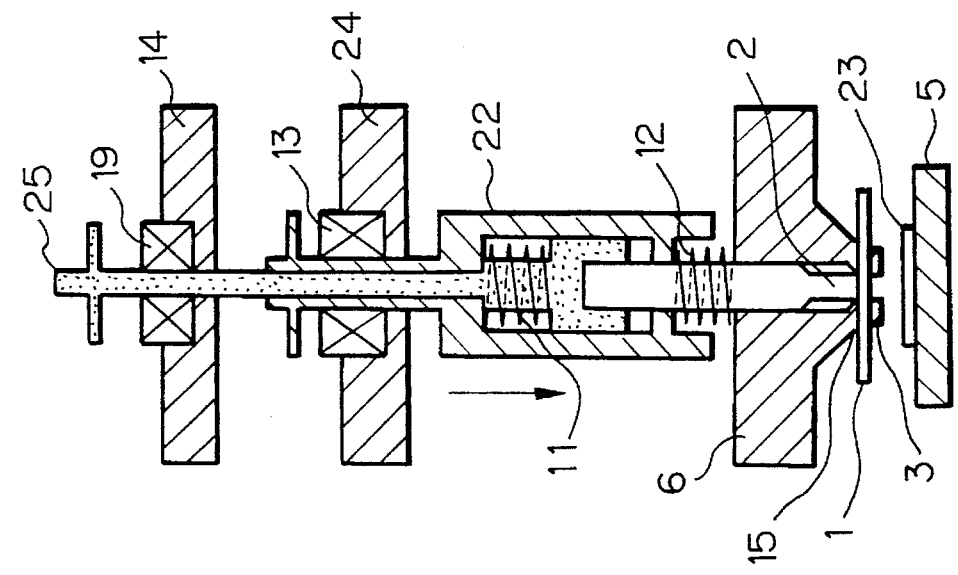

As shown in FIG. 3, AuSn has a tensile stress sequentially decreasing with an increase in temperature and softens at a temperature higher than 75° C. Experiments showed that bumps stamped out at temperatures lower than the softening point frequency chip off or crack, but bumps stamped at at temperatures higher than the softening point scarcely do so. In the light of this, the embodiment punches the AuSn sheet 1 while heating it to a temperature higher than the softening point, thereby producing uniform bumps. A reference will be made to FIGS. 4A–4D and FIG. 5 for describing a second embodiment of the present invention. As shown in FIG. 4A, the AuSn sheet 1 implemented as a ribbon is inserted into the slit 15 formed in the lower end of the punch holder 6. Assume that the AuSn sheet 1 is 50 μm thick and implemented by AuSn eutectic solder. When the solenoid 13 is energized, it lowers the punch 2 via a connecting rod 22 and damper spring 11 until the tip of the punch 2 abuts against the sheet 1, as shown in FIG. 4B. When the rod 22 is moved further downward, it directly urges the top of the punch 2 downward, as shown in FIG. 4C. As the rod 22 is further lowered, the punch 2 stamps out the bump 4 from the sheet 1 in cooperation with the die 3. As a result, the bump 4 is bonded to an electrode pad 23 provided on the substrate, as shown in FIG. 4D. At this moment, the first peak of the pressure profile shown in FIG. 5 appears. The punch 2 and the hole of the die 3 are assumed to have diameters of 65 μm and 75 μm, respectively. The rod 22 is brought to a stop when the lower end of the rod 22 abuts against the upper surface of the punch holder 6. The damper spring 11 damps the impact to occur when the bump 4 hits against the substrate 5. In the condition shown in FIG. 4D, the bump 4 is held between the punch 2 and the substrate 5 due to the action of the damper spring 11.

In the illustrative embodiment, while the bump 4 is held between the punch 2 and the substrate 5, the solenoid 19 is energized to cause the punch 2 to press the bump 4 against the electrode pad 23 via a second connecting rod 25. As a result, the bump 4 on the pad 23 is plastically deformed. This part of the procedure is represented by a table-like portion shown in FIG. 5 and following the first peak. The connecting rod 22 is hollow, and the connecting rod 25 extends throughout the hollow rod 22. Hence, the axes of operation of the punch 2 and solenoids 13 and 19 are aligned with each other, so that both the punching force and the subsequent pressing force act on the punch 2 vertically and efficiently. Consequently, the punch 2 and die 3 are free from misalignment which is apt to occur when the punch 2 lowered and when the it presses the bump 4. The solenoid 19 is supported by the solenoid arm 14. By pressing the bump 4 after stamping it out, it is possible to break up an oxide film between the bump 4 and the electrode pad 23 and promote the mutual metallic diffusion thereof, thereby enhancing the bond of the bump 4.

Figure 6A:
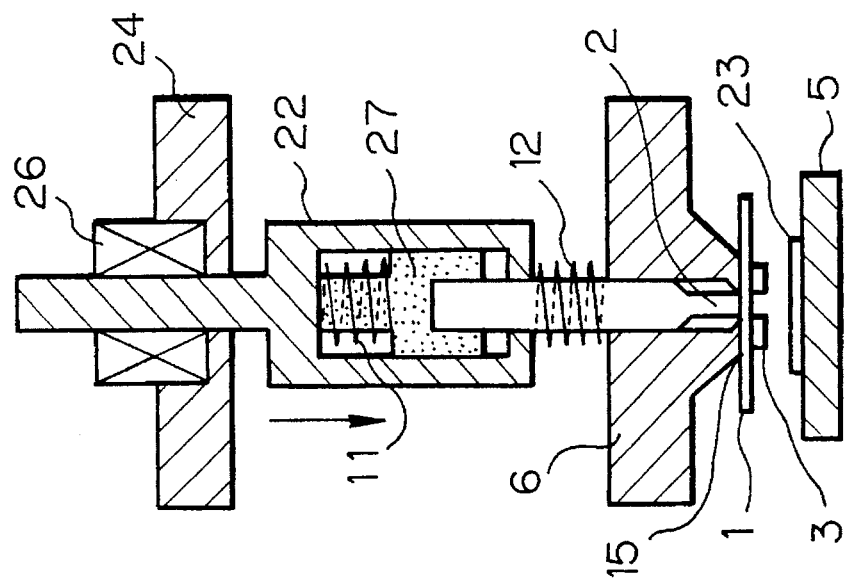
FIGS. 6A–6D are sections showing a third embodiment of the present invention.
Figure 6B:
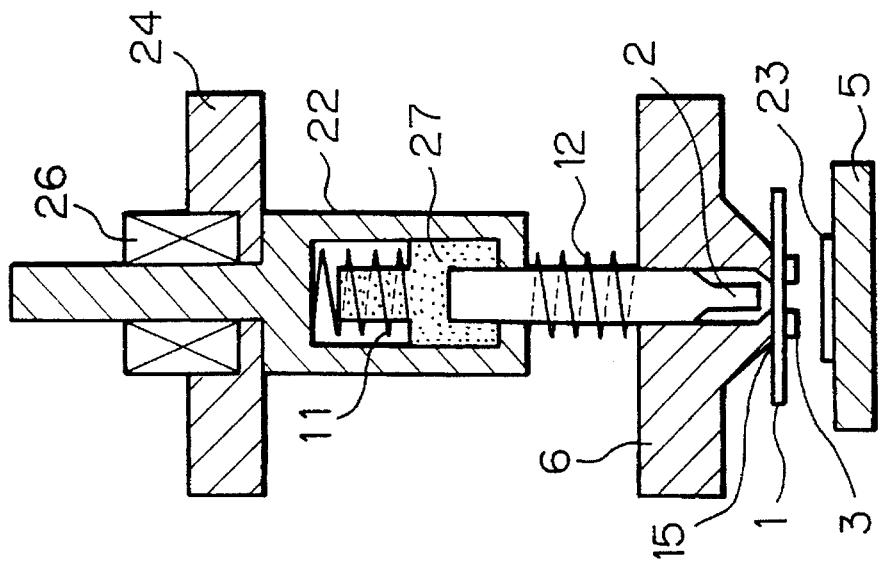
Figure 6C:
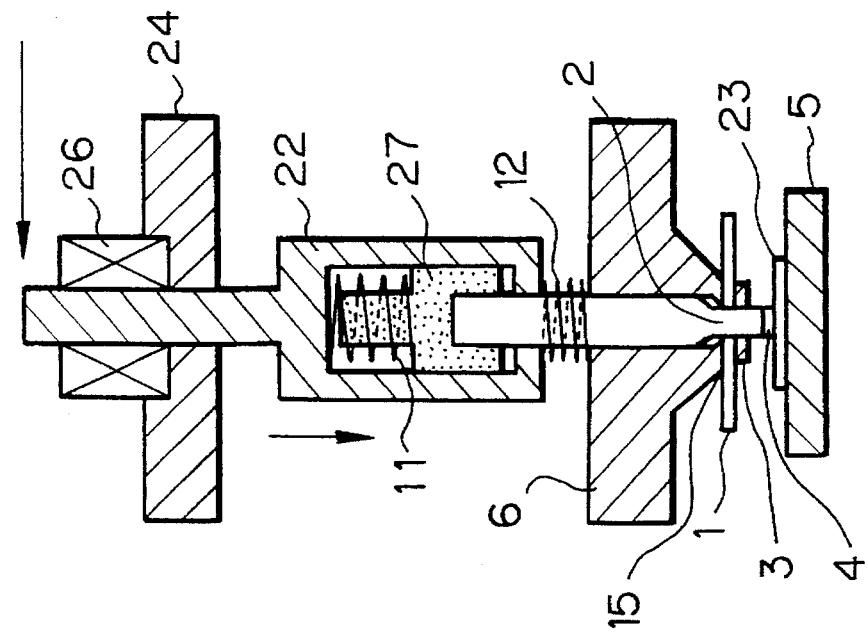
Figure 6D:
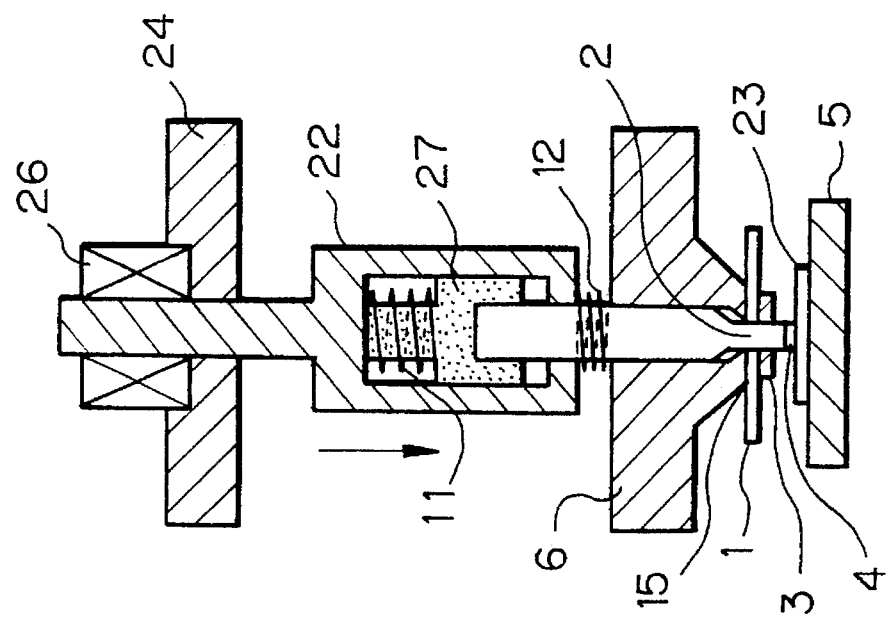

FIGS. 6A–6D show a third embodiment of the present invention which is similar to the second embodiment except that it has an actuator capable of setting a plurality of stop positions. This kind of actuator replaces the two solenoids 13 and 19 of the second embodiment and simplifies the bump forming apparatus. Specifically, an actuator 26 actuates t h e connecting rod 22 which, in turn, drives the punch 2 via the damper spring 11. As a result, the punch 2 stamps out the bump 4 from the AuSn sheet 1 in cooperation with the die 3, as shown in FIGS. 6A–6C. At the same time, the bump 4 is bonded, or temporarily affixed, to the electrode pad 23 on the substrate 5 by thermo-compression. At this instant, the rod 22 is once brought to a stop at the position shown in FIG. 6C. For this purpose, the stop position of the actuator 26 is electrically controlled. The material of the AuSn sheet I and the dimensions of the punch 2 and die 3 are assumed to be the same as in the second embodiment. The damper spring 11 located above the punch 2 damps the impact attributable to punching, as in the second embodiment. Subsequently, while the bump 4 is held between the punch 2 and the substrate 5 due to the force of the damper spring 11, the actuator 26 is moved further downward to press the punch 2, as shown in FIG. 6D. Consequently, the bump 4 is pressed against the electrode pad 23. The pressure profile described with reference to FIG. 5 also applies to the procedure described above.

In summary, it will be seen that the present invention provides a bump forming apparatus having various unprecedented advantages, as enumerated below.

(1) A connecting rod, connecting a punch and a drive source, is connected to the punch with the intermediary of a damping member. Hence, even when a bump stamped out from a metallic sheet is pressed against a substrate by the same force, the damping member damps the resulting impact. This successfully prevents the bump from collapsing and, therefore, from chipping off or cracking, while reducing spreading in the horizontal direction due to the collapse of the bump. Hence, it is possible to form bumps at a small pitch.

(2) Since a punch holder and a die are implemented as a single molding, they are free from misalignment and insure accurate punching position at all times. The die included in such a single molding is, of course, prevented from coming off the punch holder.

(3) The punch holder guides not only a shank portion but also a punch portion included in the punch to the center of the die with high accuracy, so that the misalignment of the punch and die is reduced.

(4) After the bump has been stamped out and pressed against a substrate, an additional load is applied to the bump to press it against the substrate for a sufficient period of time. As a result, the material of the bump and a metallized material on the substrate are subjected to satisfactory metallic diffusion. It follows that the bump bonding temperature can be elevated in order to enhance the bond.

(5) The bump is stamped out from a metallic sheet heated to above the softening point thereof. Hence, the bump is prevented from chipping off in the event of punching due to the elasticity of the metal.

(6) A single drive source implements both the punching step and the subsequent pressing step, thereby simplifying the construction of the apparatus.

Various modifications will become possible for those skilled in the art after receiving the teachings of the present disclosure without departing from the scope thereof. For example, while the embodiments have been shown and described as using coil springs, they are practicable even with pneumatic springs, leaf springs, rubber or similar elastic members.

What is claimed is:

1. An apparatus for punching a metallic sheet to sequentially stamp out a bump and bond said bump to a substrate in a single process step, said apparatus comprising:

a punch and a die cooperating to punch the metallic sheet;

a drive source for lowering said punch from an initial position toward said die with a first level of impacting force;

a damping member connecting said punch with said drive source;

means comprising said punch for bonding said bump to said substrate by thermo-compression with at least a second level of force which presses the bump against said substrate, said second force level bonding said bump and substrate while preventing said bump from collapsing, and, a punch return spring for thereafter raising said punch to said initial position.

2. An apparatus as claimed in claim 1, further comprising pressing means for pressing said bump against said substrate, after the bump has been bonded to the substrate by thermo-compression.

3. An apparatus as claimed in claim 1, wherein the metallic sheet is punched by said punch and die after being heated to a temperature above a softening point thereof.

4. An apparatus as claimed in claim 1, further comprising a punch holder molded integrally with said die for guiding said punch being lowered by said drive source.

5. An apparatus as claimed in claim 4, wherein said punch comprises a punch portion having an outside diameter slightly smaller than an inside diameter of said die, and a shank portion connected to said drive source, said punch holder comprising a guide portion for guiding said shank portion and a guide portion for guiding said punch portion.

6. An apparatus for punching a metallic sheet to stamp out a bump and to bond said bump to a substrate, said apparatus comprising:

a punch and a die for punching the metallic sheet to form a bump and for bonding the resulting bump to the substrate;

a first drive force for driving said punch; and a second drive force for further pressing said bump against the substrate, after the bump has been stamped out;

said punch and said first and second drive sources having axes of operation which are aligned with each other.

7. An apparatus as claimed in claim 6, wherein said first and second drive sources are constructed into a single drive source.

* * * * *